(12) United States Patent
Zundel et al.

(10) Patent No.: US 8,933,448 B2
(45) Date of Patent: Jan. 13, 2015

(54) WAFERS AND CHIPS COMPRISING TEST STRUCTURES

(75) Inventors: Markus Zundel, Egmating (DE); Uwe Schmalzbauer, Siegertsbrun (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/560,897

(22) Filed: Jul. 27, 2012

(65) Prior Publication Data

US 2014/0027772 A1    Jan. 30, 2014

(51) Int. Cl.
*H01L 23/58* (2006.01)

(52) U.S. Cl.
USPC .............................................. 257/48; 324/763

(58) Field of Classification Search
USPC ............................................ 257/48; 324/763
See application file for complete search history.

(56) References Cited

U.S. PATENT DOCUMENTS

| | | | |
|---|---|---|---|
| 6,787,801 B2 * | 9/2004 | Fischer et al. | 257/48 |
| 2004/0207057 A1 * | 10/2004 | Matsubara | 257/678 |
| 2007/0241766 A1 * | 10/2007 | Kamitai et al. | 324/763 |
| 2008/0251788 A1 * | 10/2008 | Maruyama | 257/48 |
| 2009/0121321 A1 | 5/2009 | Miccoli et al. | |
| 2011/0241713 A1 * | 10/2011 | Duarte De Martin et al. | 324/755.01 |
| 2012/0126228 A1 | 5/2012 | Fischer et al. | |

FOREIGN PATENT DOCUMENTS

JP          11-26615     *    1/1999

\* cited by examiner

*Primary Examiner* — Tan N Tran
(74) *Attorney, Agent, or Firm* — Slater & Matsil, L.L.P.

(57) ABSTRACT

Wafers with chips thereon and corresponding chips are provided where test structures or parts thereof are provided in a peripheral chip area of the chip. Corresponding methods are also disclosed.

24 Claims, 4 Drawing Sheets

WAFERS AND CHIPS COMPRISING TEST STRUCTURES

TECHNICAL FIELD

The present application relates to wafers and chips comprising test structures or parts thereof as well as to corresponding methods for providing such wafers and chips

BACKGROUND

For manufacturing chips comprising one ore more semiconductor devices, in many cases a plurality of such chips are formed on a wafer, and the wafer is then sliced to separate the individual chips from each other.

During such a manufacturing process, in addition to structures corresponding to the semiconductor devices to be formed, test structures are often formed on the wafer, for example PCM test structures (process control monitoring) or RCM test structures (reliability control monitoring). These test structures, which are independent from the semiconductor devices to be formed, enable a monitoring of the influence of process conditions and the like. Space occupied by these test structures cannot be used for forming the semiconductor devices.

SUMMARY OF THE INVENTION

In one embodiment a semiconductor wafer is disclosed comprising a plurality of chips and a kerf region separating the chips from each other. At least in one of the chips a test structure is formed in a peripheral chip area thereof.

In other embodiments, chips having a corresponding test structure in a peripheral chip area are disclosed.

In another embodiment, a method for manufacturing a chip is disclosed. The method comprises forming a test structure in a peripheral chip area of a chip.

DETAILED DESCRIPTION OF ILLUSTRATIVE EMBODIMENTS

Figure 1:
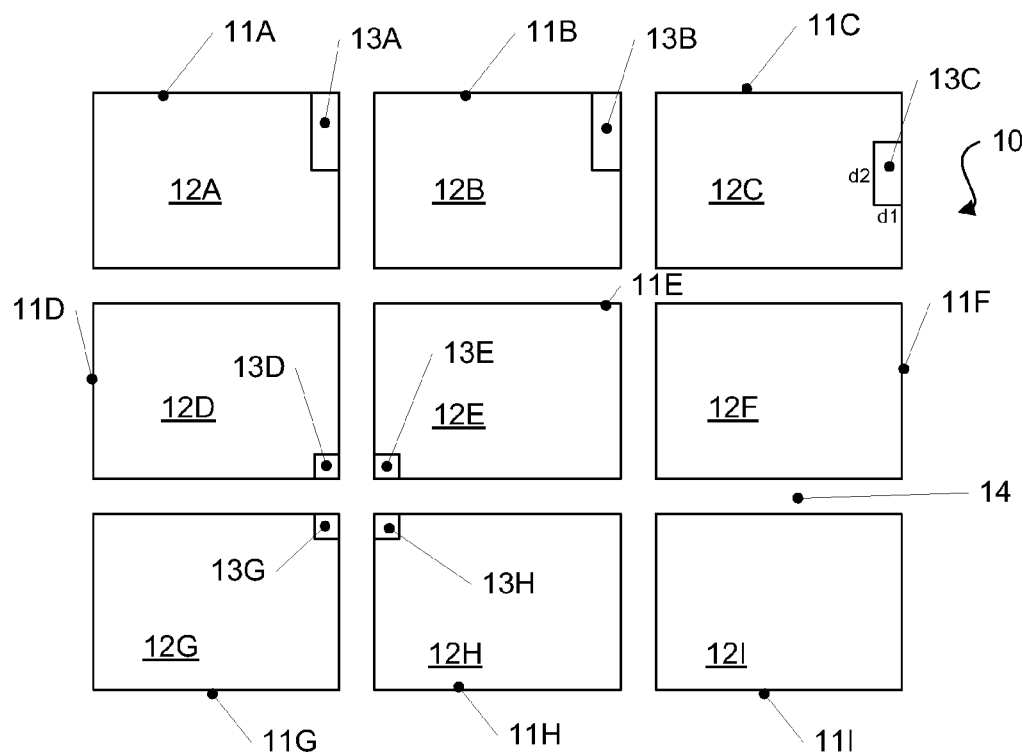
FIG. 1 is a schematic representation of a wafer according to an embodiment.

In the following, embodiments of the present invention will be described in detail. It should be noted, however, that concepts according to the present application may be embodied in many different forms, and therefore the described embodiments are not to be construed as limiting.

Features of different embodiments may be combined with each other unless specifically noted otherwise. On the other hand, describing an embodiment with a plurality of features is not to be construed as indicating that all those features are necessary for practicing the present invention, as other embodiments may comprise less features and/or alternative features.

It should further be noted that in the drawings various elements shown are not necessarily to scale with each other, but the sizes of the various elements are represented in a manner to make them easily distinguishable and therefore to provide a clear understanding of the respective embodiment.

It should be noted that directional designations like upper, lower, right and left only refer to the representation in the Figures and is not to be construed as indicating any actual location in space of products corresponding to embodiments of the present invention.

In FIG. 1, a wafer 10 according to an embodiment is shown. Wafer 10 may for example be a semiconductor wafer like a silicon wafer or a gallium arsenide wafer, but is not limited thereto and may be made of any suitable material usable as a basis for chip production.

A plurality of chips 11A to 11I is formed on wafer 10, which will be collectively referred to as chips 11 in the following. The locations where chips 11 are formed are also referred to as sites. Chips 11 are separated by a kerf region 14 there between. During the production of individual chips, wafer 10 is sliced along kerf region 14 using for example a wire saw or any other suitable device to separate chips 11 from each other. Chips 11 may then be packaged in any conventional manner.

Chips 11 may have one or more semiconductor devices like transistors or integrated circuits formed thereon in respective main areas 12A to 12I (collectively referred to as main areas 12) in any conventional manner used for chip manufacturing, for example involving lithography, doping, for example via ion beams, epitaxy and the like.

In the embodiment of FIG. 1 on some chip test structures, for example PCM test structures (process control monitoring) or RCM test structure (reliability control monitoring) are formed at peripheral chip areas. A peripheral chip area in the context of the present application generally designates an area of a chip extending from an edge of the chip inserts inwards along at least part of the edge of the respective chip. For example, in the embodiment of FIG. 1 test structures may be formed in peripheral chip area 13A of chip 11A, peripheral chip area 13B of chip 11B, peripheral chip area 13C of chip 11C, peripheral chip area 13D of chip 11D, peripheral chip area 13E of chip 11E, peripheral chip area 13G of chip 11G and peripheral chip area 13H of chip 11H. Peripheral chip areas 13A to 13H will be jointly referred to as peripheral chip areas 13. Test structures may for example comprise metal pads for electrically contacting the test structures.

In the embodiment of FIG. 1, test structures in peripheral chip areas 13D, 13E, 13G and 13H may for example be jointly used to perform a four-point measurement. Test structures provided in peripheral chip areas 13A, 13B and 13C may comprise a plurality of metal pads, for example three metal pads to perform three-point measurements, or any other number of metal pads.

As can be seen in FIG. 1, in some embodiments only some of the chips of a wafer comprise peripheral chip areas with test structures formed therein. The test structures in different peripheral chip portions may differ from each other to perform different kinds of tests. The test structures themselves may any desired conventional test structures, in particular PCM or RCM test structures. In other embodiments, test structures may be provided in peripheral chip areas of only one chip or of all chips.

The test structures formed in the peripheral chip areas may be electrically independent from any semiconductor devices formed in main areas 12 of chips 11. In particular, an electrical insulation may be provided between the test structure and semiconductor devices formed in the main area. The test structures may be used during or after the wafer production for example for process monitoring, and may be inactive in the final product shipped to customers.

It should be noted that the number and arrangement of the nine chips 11 in FIG. 1 serves merely as an example, and depending on the size of wafer and the size of the sites, i.e. the areas necessary for the chips, any appropriate number of chips may be manufactured on the wafer. Moreover, as already mentioned the representation in FIG. 1 is not to scale, and in some embodiments kerf 14 and/or peripheral chip areas 13 may be smaller with respect to the chips 11 than represented in FIG. 1.

Also, the location and form of peripheral chip areas 13 may be different from the ones shown, and more or less chips may be provided with peripheral chip areas for test structures than shown, depending on the number and type of test structures desired in a specific process. For example, peripheral chip areas may also be positioned at different locations along the edges of chips 11 than shown in FIG. 1.

Besides semiconductor structures for forming desired semiconductor devices, main areas 12 may also for example comprise metal contacts or other facilities for contacting the semiconductor structures and therefore the semiconductor devices formed.

In some embodiments, the semiconductor devices formed in main areas 12 may be nominally equivalent for all chips, for example have nominally the same electrical functionality. "Nominally equivalent" as used herein indicates that by their design the semiconductor devices have equivalent function and/or form, but deviations may exist due to process variations and the like. In other embodiments, different semiconductor devices may be formed on different chips.

As shown as an example for peripheral chip area 13C, peripheral chip areas may have a width $d1$ and a length $d2$. Width $d1$ may for example be greater than 10 times a cell pitch, i.e. a distance between adjacent cells formed e.g. in one or more of main areas 12, e.g. at least 20 times or at least 50 times a cell pitch. In some embodiments, the cell pitch may be of the order of 1 μm, and $d1$ may be at least 10 μm, at least 20 μm or at least 50 μm. $d2$ may be chosen sufficiently large to accommodate one or more metal pads, for example at least two metal pads. For example, $d2$ may be of the order of several 100 times a cell pitch. In some embodiments, $d2$ may be at least 100 μm or at least 200 μm, for example about 500 μm. A total area $d1 \times d2$ of a peripheral chip area may be of the order of 10000 $\mu m^2$ or 0.1 $mm^2$ or more.

The size of chips 11 may vary depending on the semiconductor device(s) to be formed thereon. In an embodiment, The size may be between 0.5 mm×0.8 mm and 8 mm×10 mm, for example 0.8 mm×1.0 mm or 5 mm×6 mm. For example, in some embodiments the size of the peripheral chip area may be between 1% and 20% of the size of the respective chip, for example between 5% and 15%. The above numerical values serve only as examples and may vary depending on technology requirements and/or area requirements for test structures and semiconductor devices.

Figure 2:
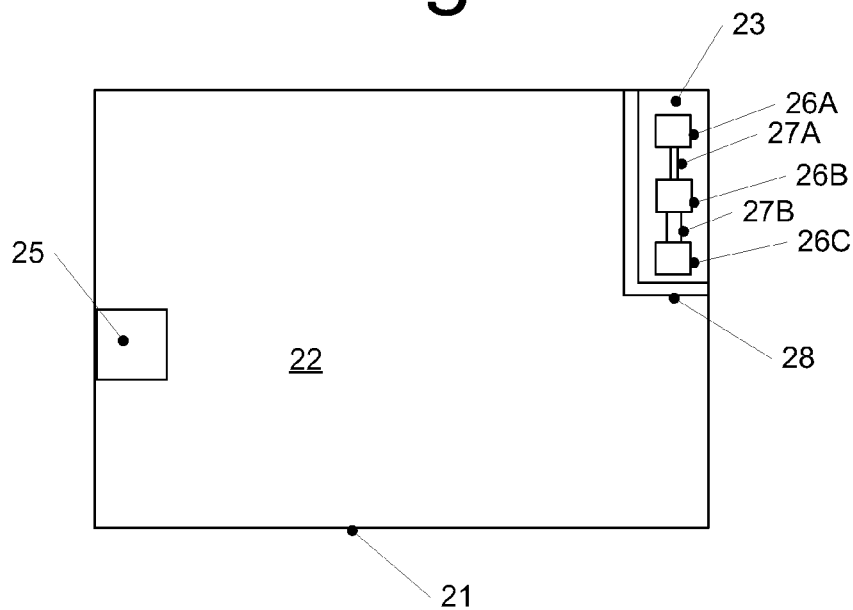
FIG. 2 is a schematic representation of a chip according to an embodiment.

In FIG. 2, a chip 21 according to an embodiment is shown. Chip 21 may for example be any of chips 11 of FIG. 1, but may also be an example for a chip obtained from a wafer different from wafer 10 of FIG. 1.

Chip 21 comprises a main area 22 where a semiconductor device, for example a transistor or an integrated circuit, may be formed. Main area 22 comprises a metal pad 25 for contacting the semiconductor device, for example for contacting a gate thereof. Main area 22 may be processed in any conventional manner.

Furthermore, chip 21 comprises a peripheral chip area 23 with a test structure formed therein. In the example the test structure comprises three metal pads 26A, 26B and 26C for contacting structures, e.g. semiconductor structures, 27A, 27B therebetween. The such formed test structure may be a PCM test structure or an RCM test structure, but is not limited thereto and may be any kind of structure desired for testing purposes. The test structure of FIG. 2 is separated from the main area by one or more drain rings 28, for example two drain rings.

Any semiconductor device formed on main area 22 may be processed, as indicated, in any conventional manner, the inner border of peripheral chip area 23 replacing the chip edge where main area 22 is adjacent to peripheral chip area 23.

As already indicated, in some embodiments, the test structure formed is used for testing purposes during or after production but is not used in the final product. In this case, in some instances it may be desirable to permanently deactivate the test structure prior to delivering the chip to a customer. For example, a so-called fuse may be provided which may be melted after the testing is completed to permanently disable and deactivate the test structure. Corresponding embodiments will now be described with reference to FIGS. 3A to 3D.

Each of FIGS. 3A to 3D shows a partial view of a chip (separate or on a wafer) with a peripheral chip area 33 and a main area 32. Main area 32 is only partially shown in FIGS. 3A to 3D.

In each of FIGS. 3A to 3D, as a simple example for a test structure two metal pads 36A, 36B and a semiconductor structure 37 to be tested for example by applying voltages and/or currents to pads 36A and 36B and/or by measuring voltages and/or currents at pads 36A and 36B are provided. Semiconductor structure 37 as shown in FIGS. 3A to 3D are coupled with metal pad 36B directly and coupled with metal pad 36A via respective fuse 38A to 38D. Fuses 38A to 38B may for example be fuses made of polysilicon. Fuses 38A to 38D may for example be implemented as planar poly fuse or as trench poly fuse. Each of fuses 38A to 38D comprises a narrow portion 39A to 39D, respectively. If a current above a predetermined threshold current is applied to the fuse, for example by applying a corresponding voltage to metal pads 36A, 36B, the fuse melts at the narrow portion, thus permanently disrupting the electrical connection. The predetermined current in embodiments is selected to be higher than a measurement current required for performing tests using the test structure. The predetermined current in embodiments is greater than 10 mA for example between 10 mA and 50 mA, however, depending on requirements other values may be chosen as well. Also, measurement currents used as mentioned above are in embodiments below these values.

Figure 3A:
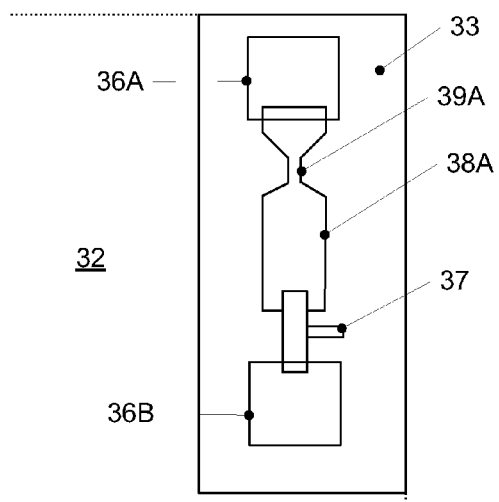
FIGS. 3A to 3D are partial views of chips or wafers according to some embodiments.

In FIG. 3A, fuse 38A is essentially symmetric with portions on both sides of narrow portion 38A having approximately the same width.

Figure 3B:
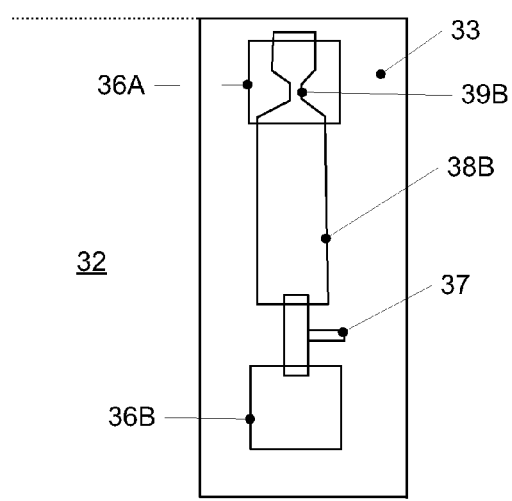

In the embodiment of FIG. 3B, the portion represented in FIG. 3B above narrow portion 39B is smaller than the portion below narrow portion 38B. Furthermore, in the embodiment of FIG. 3B narrow portion 39B is placed below metal pad 36A. In this case, when fuse 38B is melted metal pad 36A in some cases may prevent parts of the fuse from being blasted away.

Figure 3C:
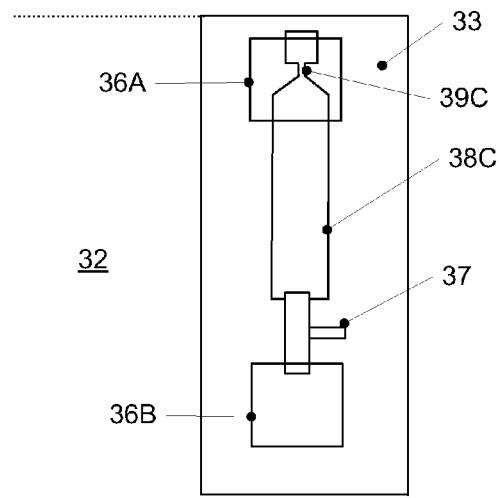

In FIG. 3C, fuse 38C is similar to fuse 39B of FIG. 3B, but the narrow portion 39C is linked in a perpendicular manner to the portion of fuse 38C represented above narrow portion 39C in FIG. 3C.

Figure 3D:
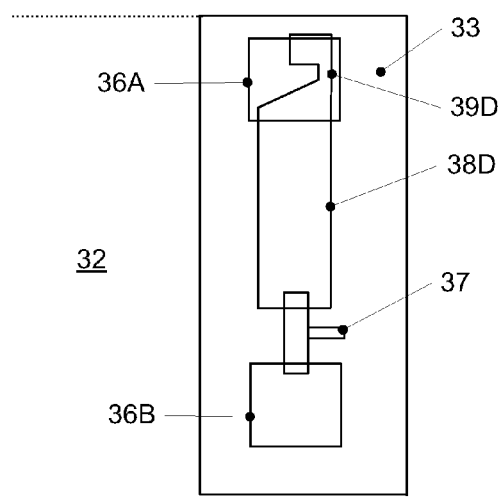

In FIG. 3D, fuse 38D is asymmetric with narrow portion 39D being placed away from main portion 32 to further reduce a risk that any parts of main portion 32 are damaged when the fuse is melted.

As can be seen from FIGS. 3A to 3D, fuses usable in embodiments of the present invention may take a plurality of different forms. Further variations than the ones shown are also possible. For example, also for the fuse 38A of FIG. 3A, narrow portion 39A may be placed below metal pad 36A. Also, the connections between the narrow portion and the remaining portions of the fuse may be perpendicular on both sides instead of only on one side as shown for example in FIG. 3C.

The test structures shown in FIGS. 3A to 3D are only simple examples and also more complex test structures comprising more metal pads, more semiconductor structures and/or more than one fuse are possible.

In the embodiments discussed so far, test structures are placed entirely in peripheral chip portions without using the kerf between the chips. In other embodiments, only part of the test structures, for example metal pads, may be placed in the peripheral chip area, and other parts of the test structures may be placed in the kerf. Corresponding embodiments will now be described with reference to FIGS. 4 and 5.

Figure 4:
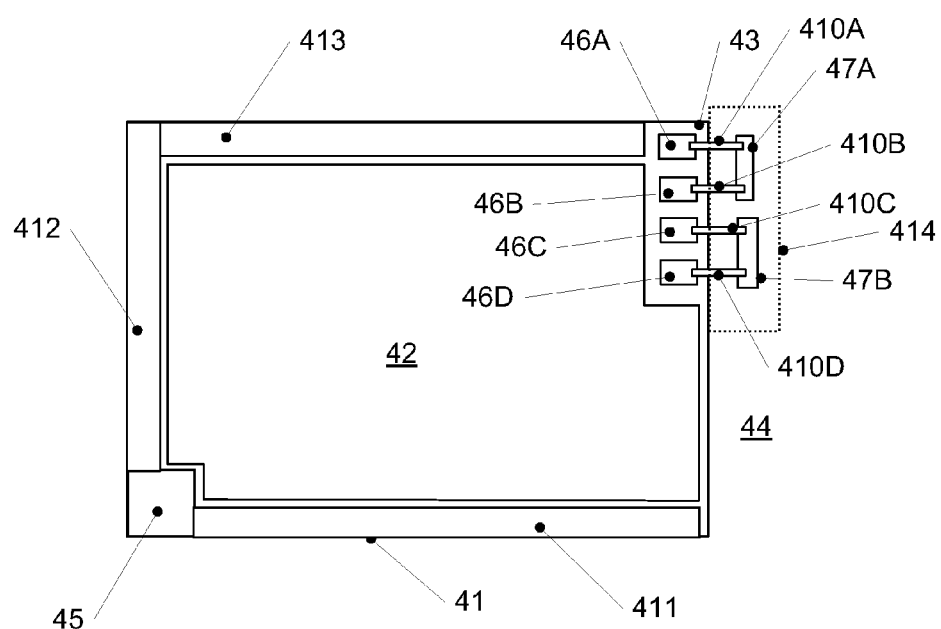
FIG. 4 is a partial view of a wafer according to an embodiment.

In FIG. 4, a part of a wafer comprising a chip 41 and an adjacent kerf 44 are shown. In the embodiment of FIG. 4, a main area of chip 41 comprises a cell field 42, a gate pad 45 and so-called gate runners 411, 412, 413 to give an example of a semiconductor device which may be implemented in the main portion of a chip. However, this structure serves only as an example, and any desired semiconductor device may be implemented.

In a peripheral chip area 43 metal pads 46A to 46D of a test structure are provided. Metal pads 46A and 46B are linked via highly doped polysilicon connections 410A, 410B, respectively, with a semiconductor structure 47A provided in kerf 44, and metal pads 46C, 46D are linked via highly polysilicon connections 410C, 410D, respectively, with a semiconductor structure 47D provided in kerf 44 to form a complete test structure. The form of the test structure shown serves only as an example, and other desired test structures may also be implemented in this way.

In the embodiment of FIG. 4, metal pads of the test structure are placed in peripheral chip area 43, and other parts of the test structure free of metal are placed in kerf 44. Polysilicon connections or other non-metal connections are used as couplings between metal pads 46A to 46D and structures 47A, 47B. In other embodiments, metal connections may be used.

When the wafer is sliced to separate the chips, the parts of the test structure in the kerf which are indicated via a dotted box 414 may be removed by the slicing, for example by a wire saw passing through these parts. As no metal parts are provided in kerf 44, in the embodiment of FIG. 4, a risk of formation of cracks and the like during the sawing process is reduced compared to a case where metal parts of test structures are provided in the kerf.

Therefore, in the embodiment of FIG. 4 in the final product (chip) in a peripheral chip area metal pads 46A to 46D with parts of polysilicon connections 410A to 410D ending at the edge of the chip are present.

Figure 5:
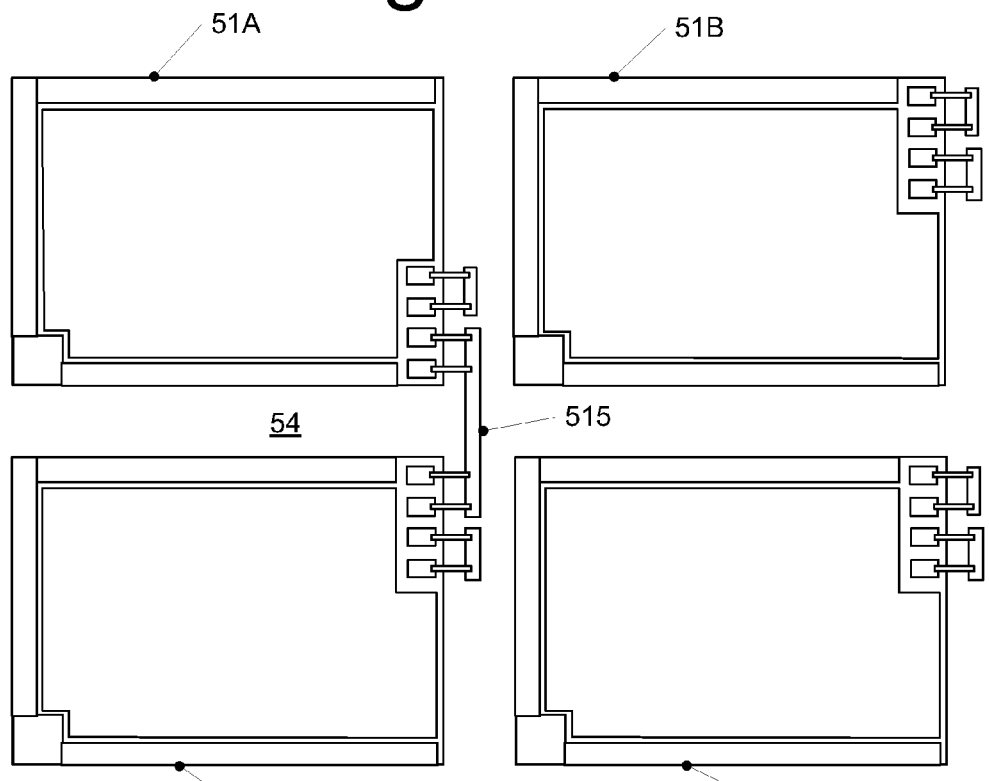
FIG. 5 is a schematic representation of a part of a wafer according to an embodiment.

In FIG. 5, a part of a wafer according to an embodiment comprising four chips 51A to 51D is shown.

Chips 51B and 51D are similar to chip 41 of FIG. 4 and comprise metal pads in a peripheral chip area thereof which are linked to structures in a kerf via polysilicon connections.

Chip 51C also has a similar structure to chip 41 with an exception that the two upper metal pads of chip 51C in FIG. 5 are coupled via polysilicon connections with a semiconductor structure 515. Chip 51A also has a peripheral chip area which, instead of being placed in the upper right corner, is placed in the lower right corner. Two lower metal pads of chip 51A are also coupled with structure 515 being in kerf 54.

As can be seen in FIG. 5, in embodiments different chips may comprise different test structures or different arrangements of metal pads. Also, in some embodiments the number of metal pads may differ for different chips, or, similar to what has been explained with reference to FIG. 1, some chips on a wafer may comprise no peripheral chip area with test structures or parts thereof.

Therefore, chips produced from a wafer according to an embodiment like the embodiment of FIG. 5 may have nominally equivalent electrical functions, but may differ in the location and/or form of parts of test structures in peripheral chip areas thereof.

It should be noted that the semiconductor device with source cell field 42, gate electrode 45 and gate runners 411 to 413 serves only as an example which may also be used in chips according to other embodiments. On the other hand, as already noted, other semiconductor structures may also be applied.

In the embodiment of FIGS. 4 and 5, the borders of source cell field 42 conform to the peripheral chip area 43 and to other elements like gate runners 411 to 413 and gate electrode 45 using only right angles. In other embodiments, also bevelled corners may be used.

Figure 6:
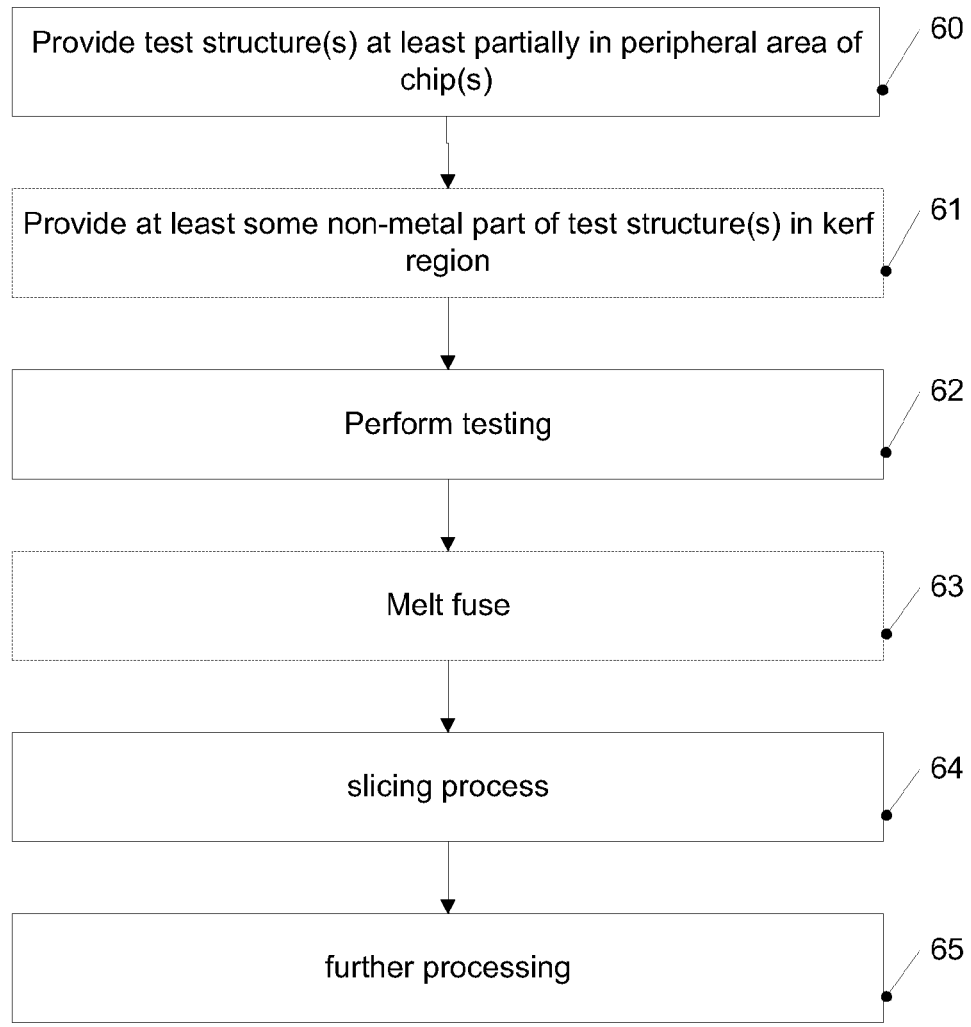
FIG. 6 is a flow chart illustrating a method according to an embodiment.

In FIG. 6, a flow chart illustrating a manufacturing method according to an embodiment is shown.

At 60, one or more test structures are at least partially provided in peripheral chip regions of one or more chips on a wafer. For example, at least metal parts of test structures are provided in the peripheral chip regions.

In case not the complete test structures are provided in the peripheral chip regions, at 61 optionally further parts e.g. non-metal parts of test structures may be provided in kerf regions of the wafer, as for example explained with reference to FIGS. 4 and 5.

After or during the chip production, at 62 testing of the test structures is performed, for example by applying measurement currents and/or measurement voltages.

In case of test structures comprising fuses as explained for example with reference to FIG. 3A to 3D, at 63 optionally the fuses are melted after the testing at 62 has been completed.

At 64 a slicing process is performed to separate chips on a wafer from each other, and at 65 the chips are further processed, for example packaged.

It should be noted that the various actions described with reference to FIG. 6 do not necessarily have to be performed in the order indicated. For example, the providing of the test structures partially in peripheral chip regions and the providing of at least some parts of the test structures in the kerf region at 61 may be performed at least partially simultaneously during wafer processing, or the performing of the testing at 62 and optionally the melting of a fuse at 63 may also be performed after the slicing process at 64 in case no parts of the test structure are provided in the kerf region where they are destroyed during the slicing process.

As can be seen from the above explanations, a plurality of variations and modifications may be performed with respect to the presented embodiments, which are therefore not to be construed as limiting the scope of the present application.

What is claimed is:

1. A wafer comprising:
   a plurality of chips, said chips being separated from each other by a kerf region; and
   a chip of the plurality of chips comprising a main area with a semiconductor device disposed therein and a peripheral chip area, wherein the peripheral chip area designates an area of the chip extending from an edge inwards along at least part of the edge, wherein a test structure is disposed in said peripheral chip area, and wherein said peripheral chip area is electrically insulated from said main area.

2. The wafer of claim 1, wherein said test structure comprises a complete test structure.

3. The wafer of claim 1, wherein a further part of said test structure is located in said kerf region.

4. The wafer of claim 3,
   wherein said part of said test structure comprises a metal pad,
   wherein said further part of said test structures comprises a semiconductor structure, and
   wherein said metal pad is coupled with said semiconductor structure via polysilicon connections.

5. The wafer of claim 3, wherein said further part is a metal-free part.

6. The wafer of claim 1, wherein said plurality of chips comprises two or more chips, wherein test structures of two or more chips differ from each other.

7. The wafer of claim 6, wherein a part of a test structure of a first chip of said two or more chips comprises a metal pad, wherein said test structure of a second chip of said two or more chips comprises a metal pad, wherein said metal pad of said first chip and said metal pad of said second chip are both coupled to a same structure in said kerf region.

8. The wafer of claim 1, wherein said test structure comprises at least one of a process control monitoring (PCM) test structure or a reliance control monitoring (RCM) test structure.

9. The wafer of claim 1,
   wherein a further chip of said plurality of chips is free of parts of test structures.

10. A chip comprising:
    a main area with a semiconductor device disposed therein, and
    a peripheral chip area with a test structure disposed therein, wherein the peripheral chip area designates an area of the chip extending from an edge inwards along at least part of the edge, and wherein said peripheral chip area is electrically insulated from said main area.

11. The chip of claim 10, wherein said main area comprises a metal pad.

12. The chip of claim 10, wherein said test structure is permanently electrically deactivated.

13. The chip of claim 12, wherein said test structure comprises a melted fuse to electrically deactivate said test structure.

14. The chip of claim 10, wherein said test structure comprises a metal pad and a polysilicon connection running from said metal pad to an edge of said chip.

15. The chip of claim 10, wherein said test structure comprises a complete test structure.

16. The chip of claim 10, wherein said test structure is one of a process control monitoring (PCM) or a reliance control monitoring (RCM) test structure.

17. A group of chips comprising:
    a first chip comprising a main area with a semiconductor device disposed therein and a peripheral chip area with a test structure disposed therein, wherein the peripheral chip area designates a first area of the first chip extending from an edge of the first chip inwards along at least part of the edge;
    a second chip comprising a main area with a semiconductor device disposed therein and a peripheral chip area with a test structure disposed therein, wherein the peripheral chip area designates a second area of the second chip extending from an edge of the second chip inwards along at least part of the edge; and
    a third chip free of a test structure, wherein said test structure of said first chip differs from said test structure of said second chip, and wherein said peripheral chip area of the first chip is electrically insulated from said main area of the first chip.

18. The group of chips of claim 17, wherein said semiconductor device of said first chip and said semiconductor device of said second chip are nominally electrically equivalent.

19. The group of chips of claim 17, wherein said semiconductor devices of said first to third chips are nominally electrically equivalent.

20. The group of chips of claim 17, wherein said peripheral chip area of the second chip is electrically insulated from said main area of the second chip.

21. A chip comprising:
    a top surface;
    a bottom surface;
    sidewalls connecting the top surface and the bottom surface;
    a main area disposed between the top surface and the bottom surface, wherein the main area comprises a semiconductor device; and
    a peripheral area disposed between the top surface and the bottom surface, wherein the peripheral area comprises a test structure, and wherein the test structure comprises a disconnected fuse.

22. The chip of claim 21, wherein the disconnected fuse is disposed between a first metal pad and a second metal pad.

23. The chip of claim 21, wherein the test structure comprises a metal pad and a polysilicon connection running from the metal pad to a sidewall of the chip.

24. The chip of claim 21, wherein the test structure is one of a process control monitoring (PCM) or a reliance control monitoring (RCM) test structure.

* * * * *